United States Patent
Liu

(10) Patent No.: US 11,678,450 B2
(45) Date of Patent: Jun. 13, 2023

(54) COUPLING ASSEMBLY AND DISPLAY TERMINAL

(71) Applicant: BEIJING XIAOMI MOBILE SOFTWARE CO., LTD., Beijing (CN)

(72) Inventor: Jianwei Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/519,060

(22) Filed: Nov. 4, 2021

(65) Prior Publication Data
US 2022/0346257 A1 Oct. 27, 2022

(30) Foreign Application Priority Data
Apr. 25, 2021 (CN) .......................... 202110448965.7

(51) Int. Cl.
| | | |
|---|---|---|
| G06F 1/16 | (2006.01) | |
| H05K 5/02 | (2006.01) | |
| F16C 11/04 | (2006.01) | |
| H05K 5/00 | (2006.01) | |
| E05D 3/12 | (2006.01) | |

(52) U.S. Cl.
CPC .......... *H05K 5/0226* (2013.01); *F16C 11/045* (2013.01); *G06F 1/1641* (2013.01); *G06F 1/1681* (2013.01); *H05K 5/0017* (2013.01); *E05D 3/122* (2013.01); *E05Y 2900/606* (2013.01)

(58) Field of Classification Search
None
See application file for complete search history.

(56) References Cited

U.S. PATENT DOCUMENTS

| | | | | |
|---|---|---|---|---|
| 2007/0213000 A1* | 9/2007 | Day | .................. | H05K 7/20754 361/695 |
| 2011/0307102 A1* | 12/2011 | Czamara | ............ | H05K 7/20836 700/282 |
| 2011/0316337 A1* | 12/2011 | Pelio | ..................... | H05K 7/1492 307/24 |
| 2012/0092811 A1* | 4/2012 | Chapel | ..................... | H02B 1/04 361/622 |
| 2016/0021793 A1* | 1/2016 | Chen | ..................... | H05K 7/202 361/679.02 |
| 2017/0013745 A1* | 1/2017 | Wilcox | ............. | H05K 7/20745 |
| 2017/0359917 A1* | 12/2017 | Bailey | ................. | H05K 7/1485 |
| 2019/0171799 A1* | 6/2019 | Crawford | ............... | G06F 21/31 |
| 2019/0261534 A1* | 8/2019 | Jochim | ................ | H05K 7/1497 |
| 2020/0146186 A1* | 5/2020 | Fotouh | ................. | E04B 2/7401 |

(Continued)

*Primary Examiner* — Anthony Q Edwards
*Assistant Examiner* — Rashen E Morrison
(74) *Attorney, Agent, or Firm* — Cozen O'Connor

(57) ABSTRACT

A coupling assembly includes: a screw rod; a holder mounted on the screw rod; a shaft sleeve set and a connection rod set. The shaft sleeve set includes: a first shaft sleeve embedded in the holder; and a second shaft sleeve fitted over the screw rod at an outer side and slidable on the screw rod. The connection rod set includes: a first connection rod having an end fixedly coupled to the first shaft sleeve; and a second connection rod having an end fixedly coupled to the second shaft sleeve, the second connection rod and the first connection rod crossing and being coupled at a junction. The first connection rod and the second connection rod cross to form an angle.

20 Claims, 4 Drawing Sheets

(56) References Cited

U.S. PATENT DOCUMENTS

2020/0265175 A1\* 8/2020 Martin ................ G06F 3/04815
2021/0219460 A1\* 7/2021 Bailey .................. H05K 7/1481
2021/0337687 A1\* 10/2021 Chen .................... H05K 5/0226

\* cited by examiner

COUPLING ASSEMBLY AND DISPLAY TERMINAL

CROSS-REFERENCE TO RELATED APPLICATION

This application claims benefit of and priority to Chinese Patent Application Serial No. 202110448965.7, filed on Apr. 25, 2021, the entire contents of which are incorporated herein by reference.

TECHNICAL FIELD

The present disclosure generally relates to the field of electronic technology and, more particularly, to a coupling assembly and a display terminal.

BACKGROUND

With the development of electronic devices, coupling assemblies such as pivot and/or hinge structures are frequently used in foldable devices. The pivots or hinges may connect two separate parts, realizing a folded state and an unfolded state. The pivots, hinges and other coupling structures may connect two different areas of a flexible structure to allow the flexible structure to assume different postures when pulled by the pivots and hinges. Hence, the structural stability and functionality of the pivots, hinges and similar coupling structures may directly affect the overall performance and user experience of the foldable devices.

SUMMARY

Embodiments of the present disclosure provide a coupling assembly. The coupling assembly includes: a screw rod; a holder mounted on the screw rod; a shaft sleeve set; and a connection rod set. The shaft sleeve set includes: a first shaft sleeve embedded in the holder, the holder restricting movement of the first shaft sleeve in a direction along the screw rod, and at least part of the screw rod being arranged in the first shaft sleeve; and a second shaft sleeve fitted over the screw rod at an outer side and slidable on the screw rod. The connection rod set includes: a first connection rod having a first end fixedly coupled to the first shaft sleeve; and a second connection rod having a first end fixedly coupled to the second shaft sleeve, the second connection rod and the first connection rod crossing with each other and being coupled at a junction. There is a first distance between the first shaft sleeve and the second shaft sleeve, and the first connection rod and the second connection rod cross to form a first angle; there is a second distance between the first shaft sleeve and the second shaft sleeve, and the first connection rod and the second connection rod cross to form a second angle; the second angle is different from the first angle.

Embodiments of the present disclosure provide a display terminal. The display terminal includes: at least one coupling assembly; and a foldable display screen. The coupling assembly includes: a screw rod; a holder mounted on the screw rod; a shaft sleeve set; and a connection rod set. The shaft sleeve set includes: a first shaft sleeve embedded in the holder, the holder restricting movement of the first shaft sleeve in a direction along the screw rod, and at least part of the screw rod being arranged in the first shaft sleeve; and a second shaft sleeve fitted over the screw rod at an outer side and slidable on the screw rod. The connection rod set includes: a first connection rod having a first end fixedly coupled to the first shaft sleeve; and a second connection rod having a first end fixedly coupled to the second shaft sleeve, the second connection rod and the first connection rod crossing with each other and being coupled at a junction. There is a first distance between the first shaft sleeve and the second shaft sleeve, and the first connection rod and the second connection rod cross to form a first angle; there is a second distance between the first shaft sleeve and the second shaft sleeve, and the first connection rod and the second connection rod cross to form a second angle; the second angle is different from the first angle. The foldable display screen is fixed on the coupling assembly and configured to unfold or fold when a distance between a first shaft sleeve and a second shaft sleeve of the coupling assembly switches between a first distance and a second distance.

BRIEF DESCRIPTION OF THE DRAWINGS

The drawings herein are incorporated into the specification and constitute a part of the specification, show embodiments consistent with the present disclosure, and together with the specification are used to explain the principles of the present disclosure.

DETAILED DESCRIPTION OF EMBODIMENTS

Exemplary embodiments will be described in detail, with examples thereof illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices consistent with aspects of the present disclosure as recited in the appended claims.

Figure 1:
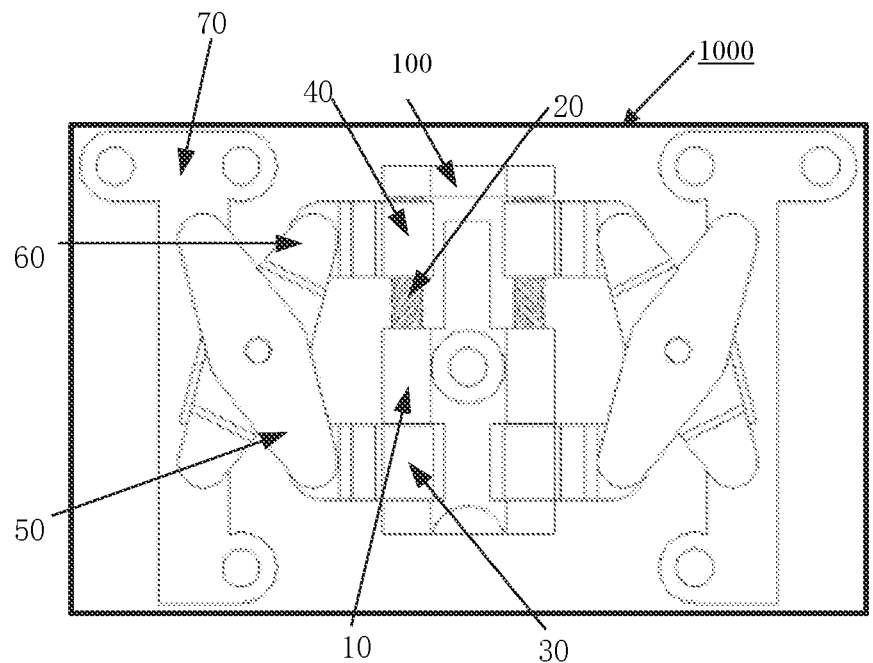
FIG. 1 is a schematic diagram of a coupling assembly according to an exemplary embodiment of the present disclosure.

As illustrated in FIG. 1, embodiments of the present disclosure provide a coupling assembly. The coupling assembly includes: a screw rod 20; a holder 10 mounted on the screw rod 20; a shaft sleeve set including a first shaft sleeve 30 and a second shaft sleeve 40, in which at least part of the screw rod is located in the first shaft sleeve 30, the second shaft sleeve 40 is fitted over the screw rod 20 at an outer side, the first shaft sleeve 30 is embedded in the holder 10, the holder 10 restricts movement of the first shaft sleeve 30 in a direction along the screw rod 20, and the second shaft sleeve 40 can slide on the screw rod 20; and a connection rod set including a first connection rod 50 and a second connection rod 60, in which the first connection rod 50 has a first end fixedly coupled to the first shaft sleeve 30, the second connection rod 60 has a first end fixedly coupled to the second shaft sleeve 40, and the second connection rod 60 and the first connection rod 50 cross and are coupled at a junction. There is a first distance between the first shaft sleeve 30 and the second shaft sleeve 40, and the first connection rod 50 and the second connection rod 60 cross to form a first angle. There is a second distance between the first shaft sleeve 30 and the second shaft sleeve 40, and the first connection rod 50 and the second connection rod 60 cross to form a second angle. The second angle is different from the first angle.

In embodiments of the present disclosure, the coupling assembly can be used to couple two parts that need to be relatively rotatable.

The holder 10 is a structure in various shapes which is capable of restricting the movement of the first shaft sleeve 30 in the direction along the screw rod 20.

In some embodiments, after the screw rod 20 passes through the first shaft sleeve 30, baffles are arranged in a direction in which the first shaft sleeve 30 can slide along the screw rod 20. Thus, the first shaft sleeve 30 can be limited to slide along the screw rod 20 by means of two baffles.

In some embodiments, in order to reduce the weight of the coupling assembly, the holder 10 may be designed with holes or grooves to reduce the weight of the holder 10, provided that the strength of the holder 10 is sufficient. In some embodiments, the holder 10 shown in FIG. 1 has holes in a middle position on the holder 10.

The screw rod 20 may be a screw bolt having threads on at least part of its outer surface.

For example, the screw rod 20 is threadedly engaged with the second shaft sleeve 40 having internal threads. The internal threads of the second shaft sleeve 40 are threads on an inner surface of the second shaft sleeve 40. Since the second shaft sleeve 40 may have internal threads, the position of the second shaft sleeve 40 on the screw rod 20 is changed during rotation around the screw rod 20 based on the engagement between the internal threads of the second shaft sleeve 40 and the external threads of the screw rod, thereby enabling the second shaft sleeve 40 to slide on the screw rod 20.

In embodiments of the present disclosure, the first shaft sleeve 30 and the second shaft sleeve 40 can rotate around the screw rod 20 to satisfy rotation needs of a coupled structure, and the second shaft sleeve 40 slides on the screw rod 20 relative to the first shaft sleeve 30. In this way, the need for a change in a width of the coupling assembly in a direction perpendicular to the screw rod 20 can be achieved.

In embodiments of the present disclosure, the first shaft sleeve 30 may be a shaft sleeve with a smooth inner surface and be rotatable together with the second shaft sleeve 40 around the screw rod 20, to drive the first connection rod 50 and the second connection rod 60 to rotate synchronously along with the first shaft sleeve 30 and the second shaft sleeve 40, to provide rotation for opposite two structures coupled.

The first connection rod 50 and the second connection rod 60 cross and coupled at the junction. In some embodiments, the first connection rod 50 and the second connection rod 60 are coupled at the junction by means of a shaft pin and a pin hole, so that the first connection rod 50 and the second connection rod 60 can be movably coupled at the junction, for example, to achieve fixation of the first connection rod 50 or the second connection rod 60 in a vertical plane other than its own rotation plane while achieving rotation in a vertical plane of the shaft pin.

In some embodiments, the first connection rod 50 and the second connection rod 60 cross to exhibit an "X" shape, and a distance between lines, each connecting corresponding ends of the first connection rod 50 and the second connection rod 60, changes with a cross angle between the first connection rod 50 and the second connection rod 60. The second shaft sleeve 40 can move on the screw rod 20 relative to the first shaft sleeve 30, and hence the cross angle between the first connection rod 50 and the second connection rod 60 varies, changing a distance between the screw rod 20 and respective end points of the two connection rods away from the shaft sleeves. As a result, the width of the coupling assembly itself changes, and the coupled two parts switch between an unfolded state and a folded state. The change in the width of the coupling assembly itself can provide enough space and avoid stretch when the coupled two parts are unfolded flat, and reduce wrinkles and other problems by reducing the width of the coupling assembly itself when the coupled two parts are folded, thereby avoiding excessive deformation of a foldable screen and prolonging the service life of the foldable screen.

In some embodiments, as shown in FIGS. 1, 2, 4 and 5, the first connection rod 50 and the second connection rod 60 cross to form a plurality of angles. As the second connection rod 60 slides along with the second shaft sleeve 40, a magnitude of the cross angle formed between the first connection rod 50 and the second connection rod 60 varies. As an example, a cross angle formed between the first connection rod 50 and the second connection rod 60 and toward the screw rod 20 varies when the coupling assembly assumes postures shown in FIGS. 4 and 5. Comparing FIG. 4 and FIG. 5, it can be seen that the cross angle formed between the first connection rod 50 and the second connection rod 60 and toward the screw rod 20 is larger in FIG. 4 than in FIG. 5.

In some embodiments, the cross angle formed between the first connection rod 50 and the second connection rod 60 and toward the screw rod 20 may be obtuse angle with different angular values.

In some embodiments, the first shaft sleeve 30 has internal threads, and a spiral direction of the internal threads of the first shaft sleeve 30 is opposite to a spiral direction of the internal threads of the second shaft sleeve 40. The outer surface of the screw rod 20 has first threads and second threads, and a spiral direction of the second threads is opposite to a spiral direction of the first threads. The first threads are engaged with the internal threads of the first shaft sleeve 30, and the second threads are engaged with the internal threads of the second shaft sleeve 40.

If the first shaft sleeve 30 also has internal threads, relative sliding between the screw rod 20 and the first shaft sleeve 30 may occur due to threaded engagement, and a sliding distance of the second shaft sleeve 40 relative to the first shaft sleeve 30 may be doubled while a sliding distance of the second shaft sleeve 40 on the screw rod 20 remains unchanged, so that a maximum stroke between the first shaft sleeve 30 and the second shaft sleeve 40 may be doubled. As a result, the size and weight of the coupling assembly itself can be reduced, and meanwhile, a sufficient stroke of the second shaft sleeve 40 relative to the first shaft sleeve 30 can be provided to meet the change in the width of the coupling assembly itself when the coupled parts are folded and unfolded.

In some embodiments, the first shaft sleeve 30 and the second shaft sleeve 40 have various forms, and in embodiments of the present disclosure, both the first shaft sleeve 30 and the second shaft sleeve 40 may be nuts. For example, if both the first shaft sleeve 30 and the second shaft sleeve 40 have internal threads, both the first shaft sleeve 30 and the second shaft sleeve 40 may be nuts with internal threads.

Since the first shaft sleeve 30 itself cannot slide in the direction along the screw rod 20 (i.e., it does not move along an extension direction of the screw rod 20), the first shaft sleeve 30 may be considered as a fixed shaft sleeve. The second shaft sleeve 40 may move along the screw rod 20 due to rotation and change a distance between the second shaft sleeve and the first shaft sleeve 30, so the second shaft sleeve 40 may be considered as a movable shaft sleeve.

If both the first shaft sleeve 30 and the second shaft sleeve 40 are nuts, the first shaft sleeve 30 may be considered as a fixed nut and the second shaft sleeve 40 may be considered as a movable nut.

The directions of the threads being opposite as described above may include: the first threads spiraling clockwise on the screw rod 20 and the second threads spiraling counterclockwise on the screw rod 20; or the first threads spiraling counterclockwise on the screw rod 20 and the second threads spiraling clockwise on the screw rod 20.

Since the first threads and the second threads spiral in opposite directions around the screw rod 20, the spiral direction of the internal threads of the first shaft sleeve 30, with which the first threads are engaged, is necessarily opposite to the spiral direction of the internal threads of the second shaft sleeve 40, with which the second threads are engaged.

Figure 3:
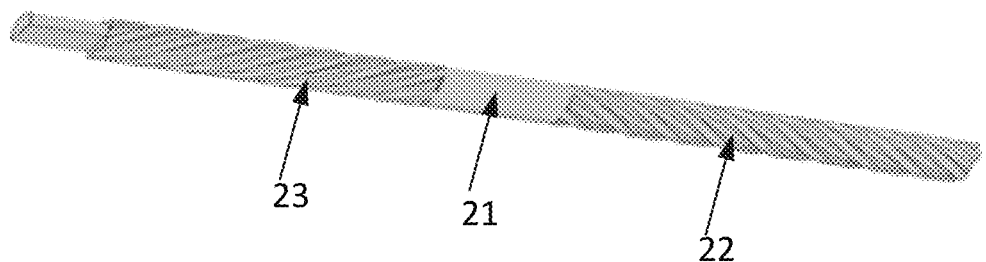
FIG. 3 is a schematic diagram of a screw rod according to an exemplary embodiment of the present disclosure.

As shown in FIG. 3, the screw rod 20 further includes a partition portion 21, and the first threads and the second threads are distributed on both sides of the partition portion. As shown in FIG. 3, two portions of the screw rod 20 provided with the first threads and the second threads respectively are located on both sides of the partition portion 21. For example, the first threads are threads 22 shown in FIG. 3, and the second threads are threads 23 shown in FIG. 3; alternatively, the first threads are threads 23 shown in FIG. 3, and the second threads are threads 22 shown in FIG. 3. As can be seen from FIG. 3, the threads 22 and the threads 23 are threads with different spiral directions.

In some embodiments, the screw rod 20 may be divided into three portions, with a middle portion as the partition portion 21. An outer surface of the partition portion may not be provided with threads, and in some embodiments, the outer surface of the partition portion is smooth.

Two portions of the screw rod 20 on both sides of the partition portion are each provided with external threads, and spiral directions of the external threads are opposite.

In some embodiments, the holder 10 is provided with two sets of fixed shaft sleeves 11, 12, an opening is formed between the two sets of fixed shaft sleeves 11, 12, and the first shaft sleeve 30 is embedded in the opening. In this way, the two sets of fixed shaft sleeves 11, 12 limit the sliding of the first shaft sleeve 30 on the screw rod 20 along the direction of the screw rod 20.

The second shaft sleeve 40 is located at a same end of the two sets of fixed shaft sleeves 11, 12, i.e., the second shaft sleeve 40 is not limited by the two sets of fixed shaft sleeves 11, 12, and the second shaft sleeve 40 can slide on the screw rod 20.

As shown in FIGS. 1, 2, 4 and 5, the holder 10 is provided with a fixed shaft sleeve 11 and a fixed shaft sleeve 12. The first shaft sleeve 30 is embedded between the fixed shaft sleeve 11 and the fixed shaft sleeve 12.

In embodiments of the present disclosure, the screw rod 20 may in fact be fixed to the holder 10, i.e., the screw rod 20 may remain stationary with respect to the holder 10, and the first shaft sleeve 30 and the second shaft sleeve 40 may rotate.

In some embodiments, the holder 10 is formed with two sets of fixed shaft sleeves that are fixed relative to each other. The two sets of fixed shaft sleeves are coupled by a connection portion on one side, and there is an opening between the two sets of fixed shaft sleeves on the other side. The first shaft sleeve 30 can be embedded in the opening and the sliding of the first shaft sleeve 30 along the direction of the screw rod 20 can be limited.

As shown in FIGS. 1-2 or FIGS. 3-4, the connection portion between the two sets of fixed shaft sleeves may be between two shaft holes or on a same side of the two shaft holes. There may be a variety of structures on the holder 10 to make two sets of fixed shaft sleeves fixed relative to each other, which will not be limited to the structure shown in the figures.

In some embodiments, the coupling assembly further includes a connection plate 70. The connection plate 70 has a sliding groove 90 and a connection member 80. A second end of the first connection rod 50, which is away from the first shaft sleeve 30, is snapped into the sliding groove 90, and a second end of the second connection rod 60, which is away from the second shaft sleeve 40, is snapped into the connection member 80. Alternatively, an end of the first connection rod 50 away from the first shaft sleeve 30 is snapped into the connection member 80, and an end of the second connection rod 60 away from the second shaft sleeve 40 is snapped into the sliding groove 90.

A distance between the first shaft sleeve 30 and the second shaft sleeve 40 varies between the first distance and the second distance, and the first connection rod or the second connection rod slides within the sliding groove 90.

The connection plate 70 may be a device directly fixed to the object to be coupled. One connection plate 70 may be fixed to an end of one connection rod set away from the screw rod 20, and when the cross angle between the two connection rods in one connection rod set changes, the connection plate 70 moves away from or close to the screw rod 20, allowing the movement of the coupled device to which the connection plate 70 is fixed.

The connection plate 70 is coupled to the connection rod by one sliding groove 90 and one connection member 80, and the connection member 80 may be a pin hole, so that one connection rod in one connection rod set can be fixedly coupled by inserting a pin shaft into the pin hole, and the other connection rod in the connection rod set can be inserted into the sliding groove 90 by a shaft pin with an aperture slightly larger than the sliding groove 90 to achieve snap in one direction and to allow the shaft pin on the connection rod to slide in the sliding groove 90 when the cross angle between the first connection rod 50 and the second connection rod 60 changes.

In some embodiments of the present disclosure, the sliding groove 90 may exhibit a beveled rectangular shape, and a length of a long side of the beveled rectangle is greater than an outer diameter of the shaft pin on the corresponding connection rod, so that the shaft pin on the connection rod can slide in the sliding groove 90. In some embodiments, a long side of the sliding groove 90 is parallel to the screw rod 20.

In some embodiments of the present disclosure, the sliding groove 90 may also be considered to exhibit a runway shape.

Figure 2:
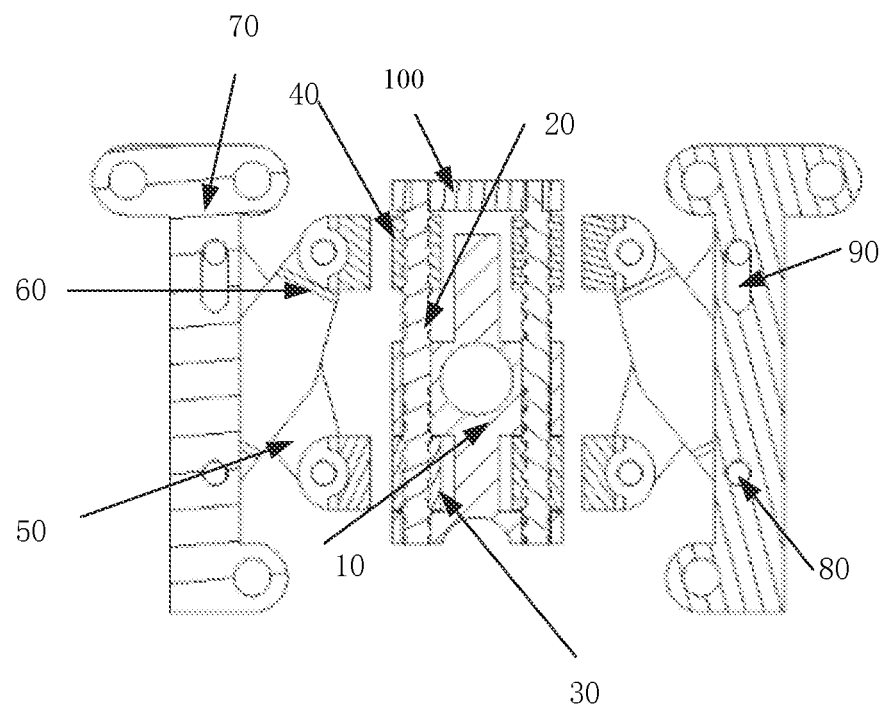
FIG. 2 is a schematic diagram of a coupling assembly according to an exemplary embodiment of the present disclosure.

The connection member 80 shown in FIG. 2 is a pin hole but it is not actually limited to a pin hole. In some embodiments, the connection member 80 may also be a slot or a pin bolt. If the connection member 80 is a slot, the corresponding connection rod has a hook that snaps into the slot, and if the connection member 80 is a pin bolt, the corresponding connection rod has a pin hole in which the pin bolt is inserted.

It should be noted that as shown in FIGS. 1, 2, 4 and 5, the connection plate 70 is also provided with one or more holes at edge positions, which can be used as connection structures for the connection plate 70 to connect the parts to be coupled by the coupling assembly. For example, the parts to be coupled by the coupling assembly may have pin bolts inserted into the holes on the connection plate 70, thereby achieving fixation between the parts and the coupling assembly.

In some embodiments, the coupling assembly includes two screw rods 20, two shaft sleeve sets, and two connection rod sets, in which one of the two screw rods 20 is coupled to one of the two shaft sleeve sets, and one connection rod set is coupled to one of the two shaft sleeve sets.

If one coupling assembly has two screw rods 20 arranged side by side and in parallel, one screw rod 20 corresponds to one shaft sleeve set and one connection rod set.

The coupling assembly includes a holder 10, and the two parallel screw rods 20 are symmetrically distributed on both sides of the holder 10 with respect to a central axis of the holder 10. One connection rod set is coupled to one shaft sleeve set.

When the connection rods in one connection rod set are coupled to the connection plate, if the first connection rod 50 is coupled to a sliding groove, the first connection rod in the other connection rod set corresponding to the other screw rod 20 is also coupled to a sliding groove; alternatively, if the second connection rod 60 is coupled to a sliding groove, the second connection rod in the other connection rod set corresponding to the other screw rod 20 is also coupled to a sliding groove. Thus, the symmetry and performance stability of the internal structure of the coupling assembly can be ensured.

In some embodiments, each of the first shaft sleeve 30 and the second shaft sleeve 40 extends outwardly on a common side to form an attachment portion, and the attachment portion is fixedly coupled to the first connection rod 50 or the second connection rod 60.

The attachment portion may have a sheet-like structure, and in some embodiments the attachment portion may be a fin or a rib. The connection rod may be coupled to the attachment portion.

The specific connection structure between the connection rod and the attachment portion may include: a pin and a pin hole, or a hook and a slot.

In embodiments of the present disclosure, there are various ways of coupling the attachment portion to the connection rod, and after the connection rod is fixed to the attachment portion, the connection rod is not translatable with respect to the attachment portion but is rotatable with respect to the attachment portion.

As shown in FIG. 1, 2, 4 or 5, the coupling assembly further includes: a synchronizing member 100 fixedly coupled to respective ends of two screw rods 20 on a common side.

In some embodiments, the synchronizing member 100 has blind holes or through holes in which the screw rods 20 may be inserted. Since the coupling assembly has two screw rods 20, the synchronizing member 100 has two blind holes or two through holes arranged side by side.

The two screw rods 20 are arranged in parallel, and the synchronizing member 100 is fixedly coupled to each of the two screw rods 20 at different positions.

The screw rods 20 are fixedly coupled to the synchronizing member 100, and the two screw rods 20 remain stationary relative to each other.

In some embodiments, the synchronizing member 100 may be a nut with two blind holes in which the screw rods 20 are arranged, and the synchronizing member 100 forms a smooth surface of the coupling assembly, which protects the internal components such as the screw rods 20.

In some embodiments, at least one of the screw rod 20 and a synchronizing member is a plastic part, and the screw rod 20 and the synchronizing member 100 may be bonded to each other by an adhesive.

In some embodiments, the screw rod 20 and the synchronizing member are both metal parts, and the screw rod 20 and the synchronizing member are welded to each other.

There are various ways of achieving fixed connection between the screw rod 20 and the synchronizing member, which will not be limited to the above-mentioned examples.

Embodiments of the present disclosure propose a foldable screen with a hinge structure, which mainly consists of a holder 10, a screw rod 20, a fixed nut, a movable nut, and a connection plate. The screw rod 20 here may be a screw bolt having threads of different spiral directions at two ends. The screw rod having threads of two different spiral directions may be referred to as a bi-directional screw rod.

The holder 10 has recesses for the fixed nut and the movable nut.

The holder 10 also has a hole for mounting the screw rod 20. In some embodiments, the hole is the aforementioned fixed shaft sleeve.

The screw rod 20 have threads in opposite spiral directions at two ends of the screw rod 20. The fixed nut and the movable nut also have threads in opposite spiral directions and fitted with both ends of the screw rod 20. Thus, the fixed nut and the movable nut can move in opposite directions when the screw rod 20 rotates.

The fixed nut and the movable nut are provided with round holes for pins of two crossed connection rods correspondingly. The connection rods are hinged in the center to form an "X" combination. An angle of the "X" combination can be changed by the rotation of the screw rod 20.

Each of the connection rods also has a pin feature at the other end, to be mounted on the connection plate 7. The connection plate has a sliding groove and a connection hole for connection with the connection rods, correspondingly.

All of the above structures are symmetrically distributed in a left-right direction, as shown in FIGS. 1, 2, 4 and 5. The screw rods 20 on left and right sides are coupled and fixed by the synchronizing member 100, so that the screw rods 20 on both sides cannot rotate relative to each other.

In embodiments of the present disclosure, the synchronizing member 100 may be a synchronizing plate, and the specific shape of the synchronizing member 100 is not limited to that shown in FIGS. 1, 2, 4 and 5.

During implementation, when the connection plate 70 rotates, the connection plate 70 drives the nut to rotate relative to the screw rod 20 through the connection rods, and the fixed nut approaches or gets away from the fixed nut. Further, the connection rods and the connection plate 70 are driven to move to meet the requirement for length change when the screen is folded.

Embodiments of the present disclosure propose a display terminal including: at least one coupling assembly provided by any of the preceding technical solutions; and a foldable display screen 1000 fixed on the coupling assembly, as shown in FIG. 1. The foldable display screen 1000 unfolds or folds when the distance between the first shaft sleeve 30 and the second shaft sleeve 40 of the coupling assembly switches between the first distance and the second distance.

The foldable screen may be a completely flexible screen or a partially flexible screen with a flexible folding area.

In embodiments of the present disclosure, when the second shaft sleeve 40 gets away from the first shaft sleeve 30, the cross angle formed between the first connection rod 50 and the second connection rod 60 and toward the screw rod 20 increases, and a length of one connection rod set in a direction perpendicular to the screw rod 20 decreases, which can provide sufficient space for the foldable screen to unfold flat. Meanwhile, the decrease in the length of one connection rod set in the direction perpendicular to the screw rod 20 can reduce the stretch of the foldable screen, avoiding deformation caused by over-stretching the foldable screen.

When the second shaft sleeve 40 approaches the first shaft sleeve 30, the cross angle formed between the first connection rod 50 and the second connection rod 60 and toward the screw rod 20 decreases, and the length of one connection rod set in the direction perpendicular to the screw rod 20 increases, which can provide enough space for redundant length of the foldable screen due to folding to spread out and reduce wrinkles. In short, the coupling assembly in embodiments of the present disclosure can reduce unnecessary stretches and wrinkles of the foldable screen during unfolding and folding, avoid the deformation of the foldable screen caused by frequent stretching and folding, prolong the service life of the foldable screen, and upgrade user experience.

Figure 4:
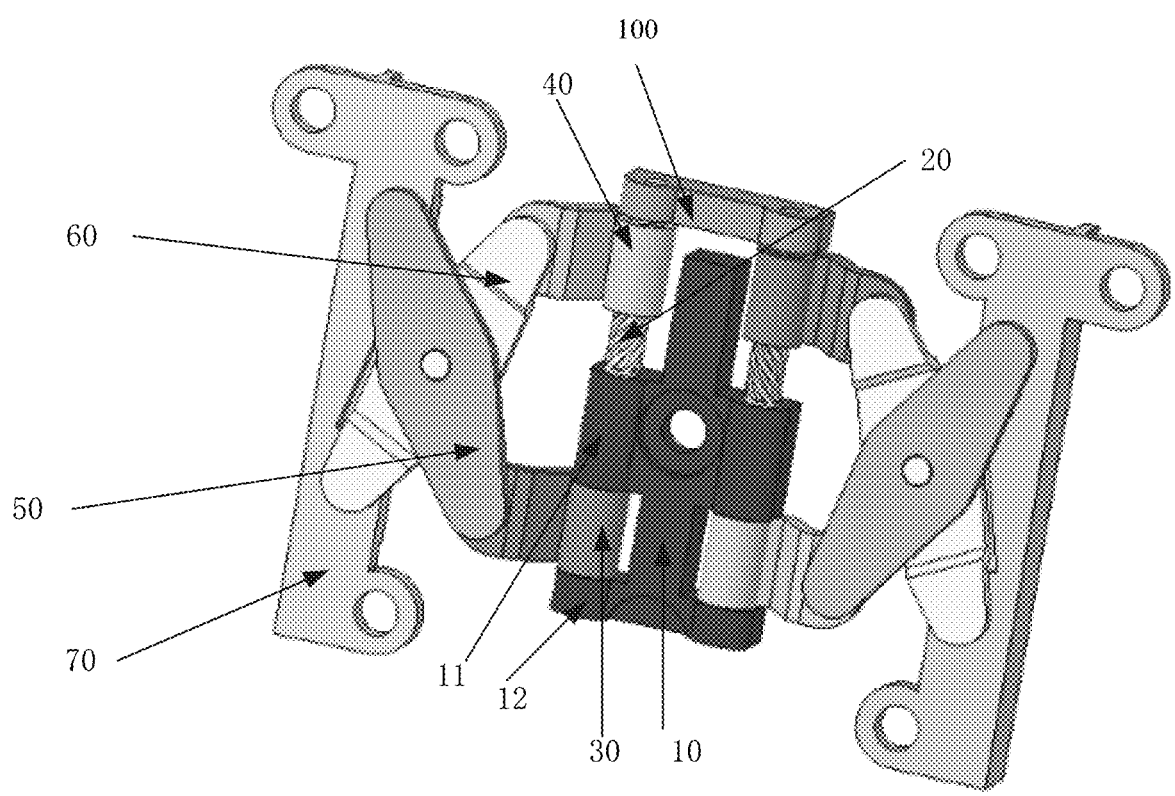
FIG. 4 is a schematic diagram of a coupling assembly according to an exemplary embodiment of the present disclosure.
Figure 5:
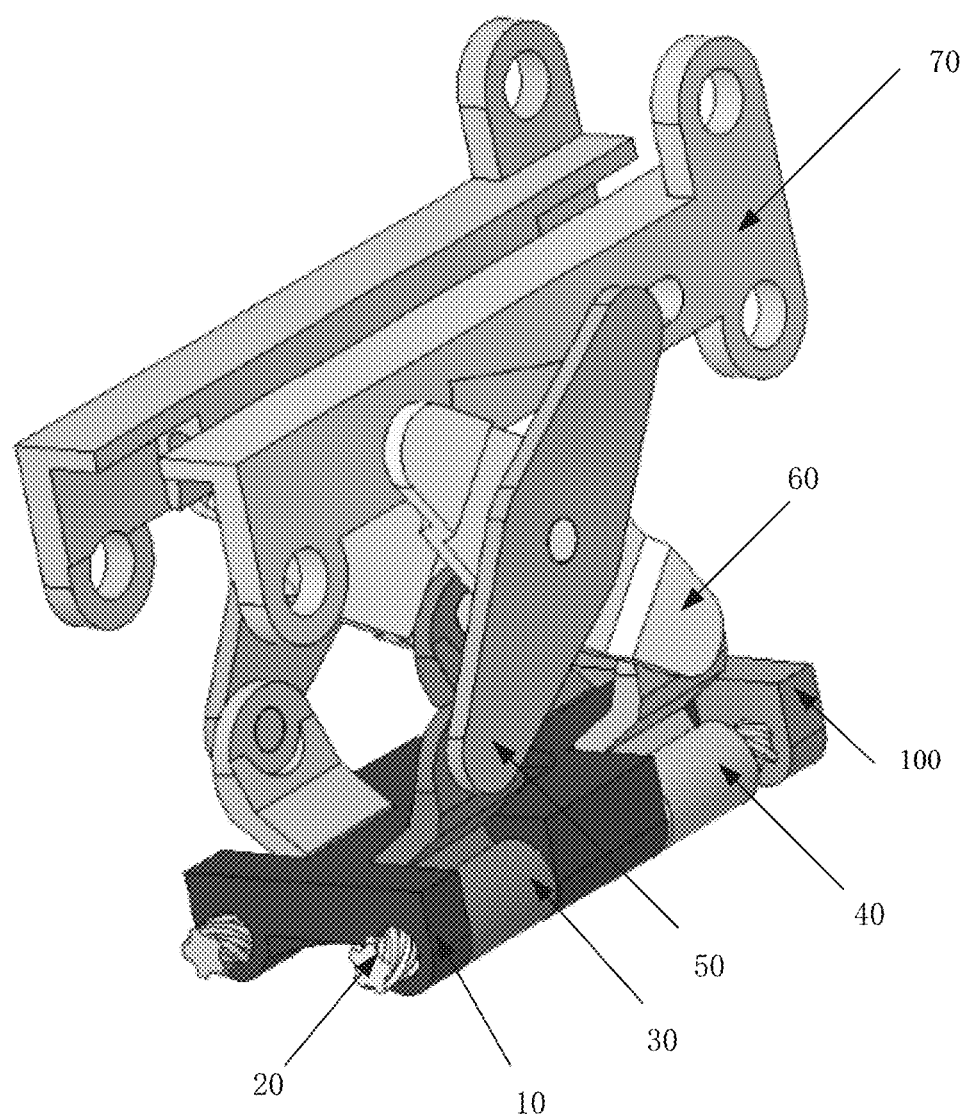
FIG. 5 is a schematic diagram of a coupling assembly according to an exemplary embodiment of the present disclosure.

In some embodiments, FIG. 4 shows a posture of the coupling assembly when the foldable screen is unfolded, and FIG. 5 shows a posture of the coupling assembly when the foldable screen is folded.

The coupling assembly provided in embodiments of the present disclosure adopts basic components such as connection rods, screw rods 20, and shaft sleeves, and thus has the characteristics of simple structure, high stability, and easy production.

The display screen may include one or more coupling assemblies, and the exact number of the coupling assemblies may be determined according to the size of the foldable screen when it fully unfolds.

Generally, the size of an area of the foldable screen when it fully unfolds is positively correlated to the number of coupling assemblies.

Figure 6:
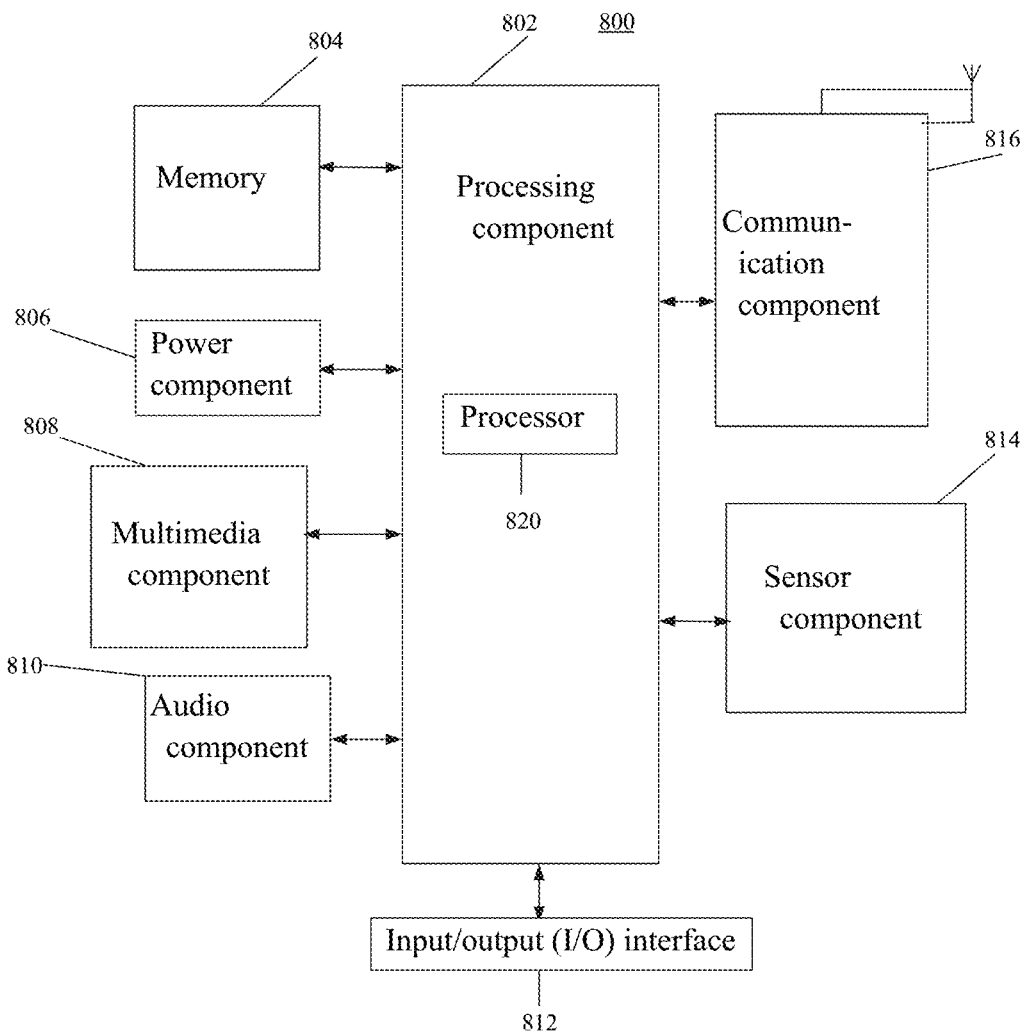
FIG. 6 is a schematic diagram of a display device according to an exemplary embodiment of the present disclosure.

FIG. 6 is a block diagram of a display device 800 according to an exemplary embodiment. For example, the display device 800 may be a mobile phone, a mobile computer, and other terminal devices or servers. In short, the display device 800 capable of data processing may be included in any kind of communication equipment.

Referring to FIG. 6, the display device 800 may include one or more of the following components: a processing component 802, a memory 804, a power component 806, a multimedia component 808, an audio component 810, an input/output (I/O) interface 812, a sensor component 814, and a communication component 816.

The processing component 802 typically controls overall operations of the display device 800, such as the operations associated with display, telephone calls, data communications, camera operations, and recording operations. The processing component 802 may include one or more processors 820 to execute instructions to perform all or part of the steps in the above described methods. Moreover, the processing component 802 may include one or more modules which facilitate the interaction between the processing component 802 and other components. For instance, the processing component 802 may include a multimedia module to facilitate the interaction between the multimedia component 808 and the processing component 802.

The memory 804 is configured to store various types of data to support the operation of the display device 800. Examples of such data include instructions for any applications or methods operated on the display device 800, contact data, phonebook data, messages, pictures, video, etc. The memory 804 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 806 provides power to various components of the display device 800. The power component 806 may include a power management system, one or more power sources, and any other components associated with the generation, management, and distribution of power in the display device 800.

The multimedia component 808 includes a screen providing an output interface between the display device 800 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 808 includes a front camera and/or a rear camera. The front camera and the rear camera may receive an external multimedia datum while the display device 800 is in an operation mode, such as a photographing mode or a video mode. Each of the front camera and the rear camera may be a fixed optical lens system or have focus and optical zoom capability.

The audio component 810 is configured to output and/or input audio signals. For example, the audio component 810 includes a microphone ("MIC") configured to receive an external audio signal when the display device 800 is in an operation mode, such as a call mode, a recording mode, and a voice recognition mode. The received audio signal may be further stored in the memory 804 or transmitted via the communication component 816. In some embodiments, the audio component 810 further includes a speaker to output audio signals.

The I/O interface 812 provides an interface between the processing component 802 and peripheral interface modules, such as a keyboard, a click wheel, buttons, and the like. The buttons may include, but are not limited to, a home button, a volume button, a starting button, and a locking button.

The sensor component 814 includes one or more sensors to provide status assessments of various aspects of the display device 800. For instance, the sensor component 814 may detect an open/closed status of the display device 800, relative positioning of components, e.g., the display and the keypad, of the display device 800, a change in position of the display device 800 or a component of the display device 800, a presence or absence of user contact with the display device 800, an orientation or an acceleration/deceleration of the display device 800, and a change in temperature of the display device 800. The sensor component 814 may include a proximity sensor configured to detect the presence of nearby objects without any physical contact. The sensor component 814 may also include a light sensor, such as a CMOS or CCD image sensor, for use in imaging applications. In some embodiments, the sensor component 814 may also include an accelerometer sensor, a gyroscope sensor, a magnetic sensor, a pressure sensor, or a temperature sensor.

The communication component 816 is configured to facilitate communication, wiredly or wirelessly, between the display device 800 and other devices. The display device 800 can access a wireless network based on a communication standard, such as WiFi, 2G, or 3G, or a combination thereof. In one exemplary embodiment, the communication component 816 receives a broadcast signal or broadcast associated information from an external broadcast management system via a broadcast channel. In one exemplary embodiment, the communication component 816 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the display device 800 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In exemplary embodiments, there is also provided a non-transitory computer-readable storage medium including instructions, such as included in the memory 804, executable by the processor 820 in the display device 800, for performing the above-described methods. For example, the non-transitory computer-readable storage medium may be a ROM, a RAM, a CD-ROM, a magnetic tape, a floppy disc, an optical data storage device, and the like.

Other embodiments of the present disclosure may be conceivable for those skilled in the art after considering the specification and practicing the technical solutions disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are regarded as exemplary only, and the true scope of the present disclosure are indicated by the following claims.

It should be understood that the present disclosure is not limited to the particular structures described above and shown in the drawings, and various modifications and changes can be made without departing from the scope of the present disclosure. The scope of the present disclosure is only limited by the appended claims.

What is claimed is:

1. A coupling assembly, comprising:
   a screw rod;
   a holder mounted on the screw rod;
   a shaft sleeve set comprising:
   a first shaft sleeve embedded in the holder, the holder restricting movement of the first shaft sleeve in a direction along the screw rod, and at least part of the screw rod being arranged in the first shaft sleeve, and
   a second shaft sleeve fitted over the screw rod at an outer side and slidable on the screw rod; and
   a connection rod set comprising:
   a first connection rod having a first end fixedly coupled to the first shaft sleeve, and
   a second connection rod having a first end fixedly coupled to the second shaft sleeve, the second connection rod and the first connection rod crossing with each other and being coupled at a junction;
   wherein the second shaft sleeve is slidable relative to the first shaft sleeve in an extension direction of the screw rod; there is a first distance between the first shaft sleeve and the second shaft sleeve, and the first connection rod and the second connection rod cross to form a first angle; there is a second distance between the first shaft sleeve and the second shaft sleeve, and the first connection rod and the second connection rod cross to form a second angle; the second angle is different from the first angle.

2. The coupling assembly according to claim 1, wherein:
   the first shaft sleeve and the second shaft sleeve both have internal threads, and a spiral direction of the internal threads of the first shaft sleeve is opposite to a spiral direction of the internal threads of the second shaft sleeve;
   the screw rod has first threads and second threads on an outer surface, and a spiral direction of the second threads is opposite to a spiral direction of the first threads;
   the first threads are engaged with the internal threads of the first shaft sleeve, and the second threads are engaged with the internal threads of the second shaft sleeve.

3. The coupling assembly according to claim 2, further comprising a partition portion, the first threads and the second threads being distributed on both sides of the partition portion.

4. The coupling assembly according to claim 1, wherein:
   the holder is formed with two sets of fixed shaft sleeves, an opening is formed between the two sets of fixed shaft sleeves, and the first shaft sleeve is embedded in the opening; and
   the second shaft sleeve is located at a same end of the two sets of fixed shaft sleeves.

5. The coupling assembly according to claim 1, further comprising a connection plate,
   wherein:
   the connection plate has a sliding groove and a connection member;
   a second end of the first connection rod away from the first shaft sleeve is snapped into the sliding groove, and a second end of the second connection rod away from the second shaft sleeve is snapped into the connection member; or the second end of the first connection rod away from the first shaft sleeve is snapped into the connection member, and the second end of the second connection rod away from the second shaft sleeve is snapped into the sliding groove;
   a distance between the first shaft sleeve and the second shaft sleeve changes between the first distance and the second distance, and the first connection rod or the second connection rod slides in the sliding groove.

6. The coupling assembly according to claim 5, wherein the sliding groove has a beveled rectangular shape.

7. The coupling assembly according to claim 1, comprising:
two screw rods arranged in parallel;
two shaft sleeve sets; and
two connection rod sets,
wherein one of the two screw rods is coupled to one of the two shaft sleeve sets, and one of the two connection rod sets is coupled to one of the two shaft sleeve sets.

8. The coupling assembly according to claim 1, wherein:
each of the first shaft sleeve and the second shaft sleeve extends outwardly on a common side to form an attachment portion; and
the attachment portion is fixedly coupled to the first connection rod or the second connection rod.

9. The coupling assembly according to claim 7, further comprising a synchronizing member fixedly coupled to respective ends of the two screw rods on a common side.

10. The coupling assembly according to claim 1, further comprising a baffle arranged at each ends of the first shaft sleeve.

11. The coupling assembly according to claim 1, wherein the holder has a hole in a middle position on the holder.

12. The coupling assembly according to claim 1, wherein the first shaft sleeve is a shaft sleeve with a smooth inner surface and is rotatable together with the second shaft sleeve around the screw rod.

13. The coupling assembly according to claim 1, wherein the first angle and the second angle are obtuse angles with different values.

14. The coupling assembly according to claim 3, wherein an outer surface of the partition portion is smooth.

15. The coupling assembly according to claim 4, wherein the two sets of fixed shaft sleeves are coupled by a connection portion.

16. The coupling assembly according to claim 8, wherein the attachment portion has a sheet-like structure.

17. The coupling assembly according to claim 9, wherein the synchronizing member has blind holes or through holes in which the screw rods are inserted.

18. The coupling assembly according to claim 9, wherein the synchronizing member forms a smooth surface of the coupling assembly.

19. The coupling assembly according to claim 4, wherein the two screw rods are mounted in the two sets of fixed shaft sleeves.

20. A display terminal comprising:
a coupling assembly comprising:
a screw rod;
a holder mounted on the screw rod;
a shaft sleeve set comprising:
a first shaft sleeve embedded in the holder, the holder restricting movement of the first shaft sleeve in a direction along the screw rod, and at least part of the screw rod being arranged in the first shaft sleeve, and
a second shaft sleeve fitted over the screw rod at an outer side and slidable on the screw rod; and
a connection rod set comprising:
a first connection rod having a first end fixedly coupled to the first shaft sleeve, and
a second connection rod having a first end fixedly coupled to the second shaft sleeve, the second connection rod and the first connection rod crossing with each other and being coupled at a junction;
wherein the second shaft sleeve is slidable relative to the first shaft sleeve in an extension direction of the screw rod; there is a first distance between the first shaft sleeve and the second shaft sleeve, and the first connection rod and the second connection rod cross to form a first angle; there is a second distance between the first shaft sleeve and the second shaft sleeve, and the first connection rod and the second connection rod cross to form a second angle; the second angle is different from the first angle; and
a foldable display screen fixed on the coupling assembly and configured to unfold or fold when a distance between the first shaft sleeve and the second shaft sleeve of the coupling assembly switches between the first distance and the second distance.

* * * * *